(12) United States Patent
Kameda et al.

(10) Patent No.: US 6,442,009 B1
(45) Date of Patent: Aug. 27, 2002

(54) SEMICONDUCTOR DEVICE HAVING PROTECTIVE AND TEST CIRCUITS

(75) Inventors: Yasushi Kameda; Makoto Segawa, both of Kanagawa-ken (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 110 days.

(21) Appl. No.: 09/604,720

(22) Filed: Jun. 28, 2000

(30) Foreign Application Priority Data

Jun. 29, 1999 (JP) .......................................... 11-184162

(51) Int. Cl.[7] ................................................. H02H 9/00
(52) U.S. Cl. ............................ 361/56; 361/54; 324/527
(58) Field of Search .............................. 361/58, 54, 56, 361/111, 57; 257/355, 356; 365/94, 96; 324/512, 527

(56) References Cited

U.S. PATENT DOCUMENTS 5,617,283 A * 4/1997 Krakauer et al. .............. 361/56
5,930,094 A * 7/1999 Amerasekera et al. ........ 361/56

FOREIGN PATENT DOCUMENTS

JP         6-244371         9/1994

* cited by examiner

Primary Examiner—Kim Huynh
(74) Attorney, Agent, or Firm—Finnegan, Henderson, Farabow, Garrett & Dunner, L.L.P.

(57) ABSTRACT

A semiconductor device has an internal circuit (2), a PAD, a NMOS Tr (QN) as a protective transistor formed between a node (N) on a signal line and a first power source (Vss), and a NOR gate (G1) as a logical gate connected to a gate as a control terminal of the NMOS transistor (QN). The internal circuit (2) is connected to the PAD through the signal line. The NOR gate (G1) keeps the protective transistor (QN) an OFF state during a normal operation of the internal circuit (2). In addition, the semiconductor device further includes a test circuit (21). The output from the NOR gate (G1), whose one input is the output from the test circuit (21), is supplied to the gate of the NMOS transistor (QN). The output from the test circuit (21) is thereby output to outside through the NMOS transistor (QN) and the PAD.

15 Claims, 5 Drawing Sheets

SEMICONDUCTOR DEVICE HAVING PROTECTIVE AND TEST CIRCUITS

CROSS-REFERENCE TO RELATED APPLICATION

This application is based upon and claims the benefit of priority from the prior Japanese Patent Application No. 11-184162, filed Jun. 29, 1999; the entire contents of which are incorporated herein by reference.

BACKGROUND OF THE INVENTION

1. Field of the Invention

The present invention relates to a semiconductor device which is provided with protective transistors as protective circuit to protect internal circuits against an over-voltage.

2. Description of the Related Art

In general, many types of conventional semiconductor integrated circuits such as semiconductor memories are provided with protective circuits in order to protect internal circuits therein against an over-voltage. This protective circuit can avoid the occurrence of electronic breakdown in insulation films and breakdown at an junction portion by an Electro-Static Discharge (ESD).

For example, a NMOS transistor QN shown in FIG. 1 is used as the protective circuit. The drain of the NMOS transistor QN is connected to a signal line connected to a pad (PAD) and both the source and gate thereof. Both the source and gate are connected to a ground voltage source (Vss).

The NMOS transistor QN can protect internal circuits by a large current flow generated by a change of a voltage between the drain and the source thereof.

The necessity of the protective circuits is becoming increasingly high according to miniaturization and high density of circuit elements in semiconductor integrated circuits. It is necessary to increase the size of the protective transistor as the protective circuit in order to increase the protection against ESD. However, this causes drawbacks to increase an input-output capacitance in the internal circuits, and also to increase the area of the semiconductor chip. Accordingly, this conventional solving method has a limit basically. Furthermore, it is desirable to apply the protective circuit to various applications other than the ESD resistance.

SUMMARY OF THE INVENTION

Accordingly, an object of the present invention is, with due consideration to the drawbacks of the conventional technique, to provide a semiconductor device with an excellent resistance against the ESD by adding a circuit of a simple configuration to a protective circuit. Further, an another object of the present invention is to provide a semiconductor device capable of applying the protective circuit to functions other than the ESD resistance.

In accordance with a preferred embodiment of the present invention, a semiconductor device has an internal circuit, a pad, a protective circuit connected between a first power source and a node on a signal line through which the pad and the internal circuit is connected, and a first logical gate connected to a control terminal of the protective circuit. The first logical gate operates to keep an OFF state in the protective circuit during a normal operation of the internal circuit. Accordingly, when the power voltage source is ON, the output of the first logical gate, namely, the gate of the protective transistor (protective circuit) as the control terminal enters a floating state. In the floating state, a small amount of forward bias is generated in the protective transistor when an over-voltage is supplied to the PAD. It is thereby possible to obtain an excellent ESD resistance when compared with a conventional semiconductor device in which the control terminal of the protective transistor is fixed to a zero of the bias voltage.

In the semiconductor device as another preferred embodiment of the present invention, the first logical gate inputs both an output signal from the test circuit and a control signal in order to set the output signal from the test circuit into an activated state, the first logical gate outputs the output signal to a gate of the protective circuit according to a level of the control signal, and the protective circuit outputs the output signal from the test circuit to outside of the semiconductor device. The test circuit is a circuit to store information of the semiconductor chip and comprises a fuse circuit, for example. The protective transistor can be used as the output transistor for the output signal from the test circuit.

In the semiconductor device as another preferred embodiment of the present invention, a plurality of the pads and a plurality of the test circuits (each test circuit corresponds to each pad) are incorporated in the semiconductor device. Each test circuit is a fuse circuit to store a desired data item which comprises a resistance and a fuse connected in series between the first power source and a second power source.

In the semiconductor device as another preferred embodiment of the present invention, an addition resistance is further incorporated. The addition resistance is connected between the pad and a second power source.

The semiconductor device as another preferred embodiment of the present invention, further includes a transistor connected between the node and a second power source, and a second logical gate for inputting a signal whose level is an inverted level of the control signal in order to activate the output signal from the test circuit. The second logical gate controls an operation of the transistor by providing the output, signal from the test circuit to the control terminal of the transistor according to the control signal of the inverted level.

In the above semiconductor device, the first logical gate and the second logical gate output complementary signals to the corresponding protective circuit and the transistor, respectively.

In the semiconductor device as another preferred embodiment of the present invention, the protective circuit is a NMOS transistor whose drain is connected to the node on the signal line, whose source is connected to the first power source, and whose gate is connected to the first logical gate. The transistor is a PMOS transistor whose drain is connected to the node on the signal line, whose source is connected to the second power source, and whose gate is connected to the second logical gate.

The semiconductor device as another preferred embodiment of the present invention, further includes a transfer control gate placed at the node on the signal line through which the pad is connected to the internal circuit. The transfer control gate operates according to the control signal to activate the output signal from the test circuit, and prevents to transfer the output signal from the test circuit to the internal circuit through the protective circuit.

In the semiconductor device as another preferred embodiment of the present invention, the transfer control gate is a CMOS transfer gate whose ON/OFF operation is performed based on a value of the control signal to activate the output signal of the test circuit. The transfer control gate prevents to transfer the output signal of the test circuit to the internal circuit when the value of the control signal indicates to activate the output signal of the test circuit.

In the semiconductor device as another preferred embodiment of the present invention, a control signal indicates whether or not a voltage potential of the PAD is fixed to a desired voltage level during an execution of a test for the internal circuit. The control signal is transferred to the first logical gate, and the first logical gate controls ON/OFF operation of the protective circuit based on the value of the control signal.

In the semiconductor device as another preferred embodiment of the present invention, a control signal indicates whether or not a voltage potential of the PAD is fixed to a desired voltage level. The control signal is transferred to the first logical gate instead of the output signal from the test circuit.

In the semiconductor device described above, the protective circuit is a NMOS transistor, whose drain is connected to the node on the signal line, whose source is connected to the first power source, and whose gate is connected to the first logical gate.

BRIEF DESCRIPTION OF THE DRAWINGS

These and other objects, features, aspects and advantages of the present invention will become more apparent from the following detailed description of the present invention when taken in conjunction with the accompanying drawings, in which.

DESCRIPTION OF THE PREFERRED EMBODIMENTS

Other features of this invention will become apparent through the following description of preferred embodiments which are given for illustration of the invention and are not intended to be limiting thereof.

First Embodiment

Figure 2:
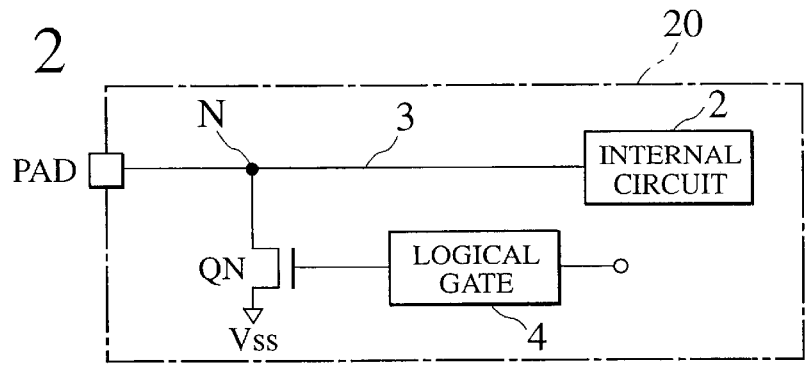
FIG. 2 is a block diagram showing a semiconductor device which is provided with a protective circuit according to the first embodiment of the present invention.

FIG. 2 is a block diagram showing the semiconductor chip 1 as a semiconductor device which is provided with a protective transistor QN as a protective circuit according to the first embodiment of the present invention. In FIG. 2, an internal circuit 2 is incorporated in the semiconductor chip 1. The protective transistor QN is connected to a node N on a signal line 3 through which the internal circuit 2 is connected to an input/output pad (Hereinafter referred to as the PAD). Although FIG. 2 briefly shows only the PAD, the protective transistor QN, and the internal circuit 2, the semiconductor chip 1 as the semiconductor device has in general a plurality of the input/output PAD, the corresponding protective transistors QN, and the internal circuits.

For example, the protective transistor QN in this first embodiment is a NMOS transistor whose drain is connected to the node N on the signal line 3, and whose source is connected to a ground voltage source (Vss) as a standard voltage potential. The gate of the protective transistor QN, as a control terminal, is connected to the output terminal of the logical gate 4 incorporated in the semiconductor chip 1. This logical gate 4 outputs a Low level (L level) during a normal operation of the internal circuit 2 in order to set the gate of the protective transistor QN to the voltage level Vss.

Figure 1:
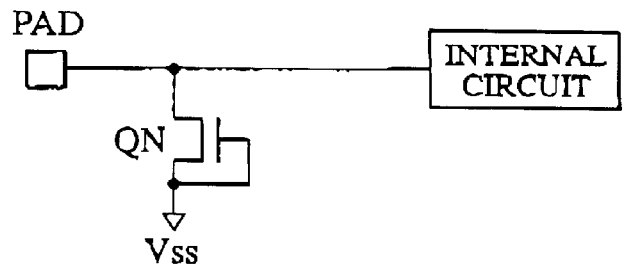
FIG. 1 is a block diagram showing a conventional semiconductor device which is incorporated within a protective transistor.

In the configuration of the semiconductor device as the first embodiment, the level of the gate of the protective transistor QN enters a floating state. When compared with the conventional semiconductor device having the configuration in which the protective transistor QN is connected to the ground voltage source Vss shown in FIG. 1, the semiconductor device of the first embodiment shown in FIG. 2 has a high ESD resistance because the gate of the protective transistor QN enters the floating state and a ESD current easily flows through the protective transistor QN. The reason for this feature is that a small amount of positive bias voltage is generated between the gate and source by supplying the positive high voltage to the gate of the protective transistor QN when compared with the conventional case where the gate is directly connected to the ground voltage source (Vss). The inventors of the present invention has detected this feature.

Accordingly, it is possible to form the semiconductor device of the first embodiment capable of being an excellent ESD resistance against the ESD by connecting the logical gate 4 to the gate of the protective transistor QN. By the way, the logical circuit 4 outputs the L level to the gate of the protective transistor QN during the normal operation of the semiconductor device. Thereby, the protective transistor QN enters the OFF state, and the state of which does not affect the operation of the internal circuit 2.

Second Embodiment

Figure 3:
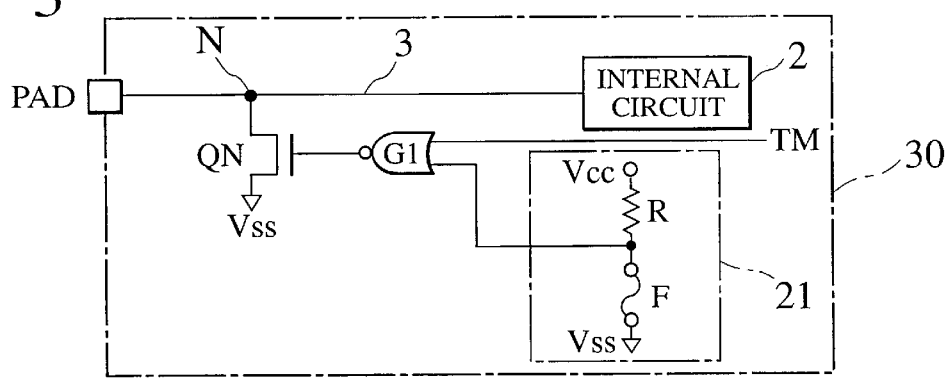
FIG. 3 is a block diagram showing a conventional semiconductor device which is provided with circuits for storing information of a semiconductor chip.

FIG. 3 is a block diagram showing the semiconductor chip 30 as a semiconductor device which is provided with the protective transistor QN as the protective circuit and the test circuit 21 according to the second embodiment of the present invention. In the configuration of the second embodiment, the test circuit 21 is further incorporated in addition to the configuration of the semiconductor device 1 according to the first embodiment shown in FIG. 2. In the configuration of the second embodiment shown in FIG. 3, the protective circuit QN is used as an output circuit in order to output test data stored in the test circuit 21 to outside of the semiconductor chip 30 as the semiconductor device through the PAD. The logical gate 4 is a NOR gate G1 for example. A test mode selection signal TM is provided to one input terminal of the NOR gate G1. This test mode selection signal TM activates the test data as the output from the test circuit 21. The test data from the test circuit 21 is supplied to the other input terminal of the NOR gate G1.

In an actual case, the test circuit 21 is made by a fuse circuit which is made up of a resistance R and a fuse F connected in series between the voltage source Vcc and the ground voltage source Vss. The value of the resistance R is adequately greater than that of the fuse F. The test data of the test circuit 21 may be set by whether or not the fuse F has been melt or not. When the fuse F is melt, the test data from the test circuit 21 becomes the H level (=Vcc), and when not, the test data from the test circuit 21 becomes the L level (=Vss), for example. In general, a plurality of the test circuits 21 are incorporated in a semiconductor chip as a semiconductor device in order to store information such as a semiconductor chip information, a wafer number, a wafer position, a production date, an address of a redundancy circuit, and the like, for example.

Figure 4:
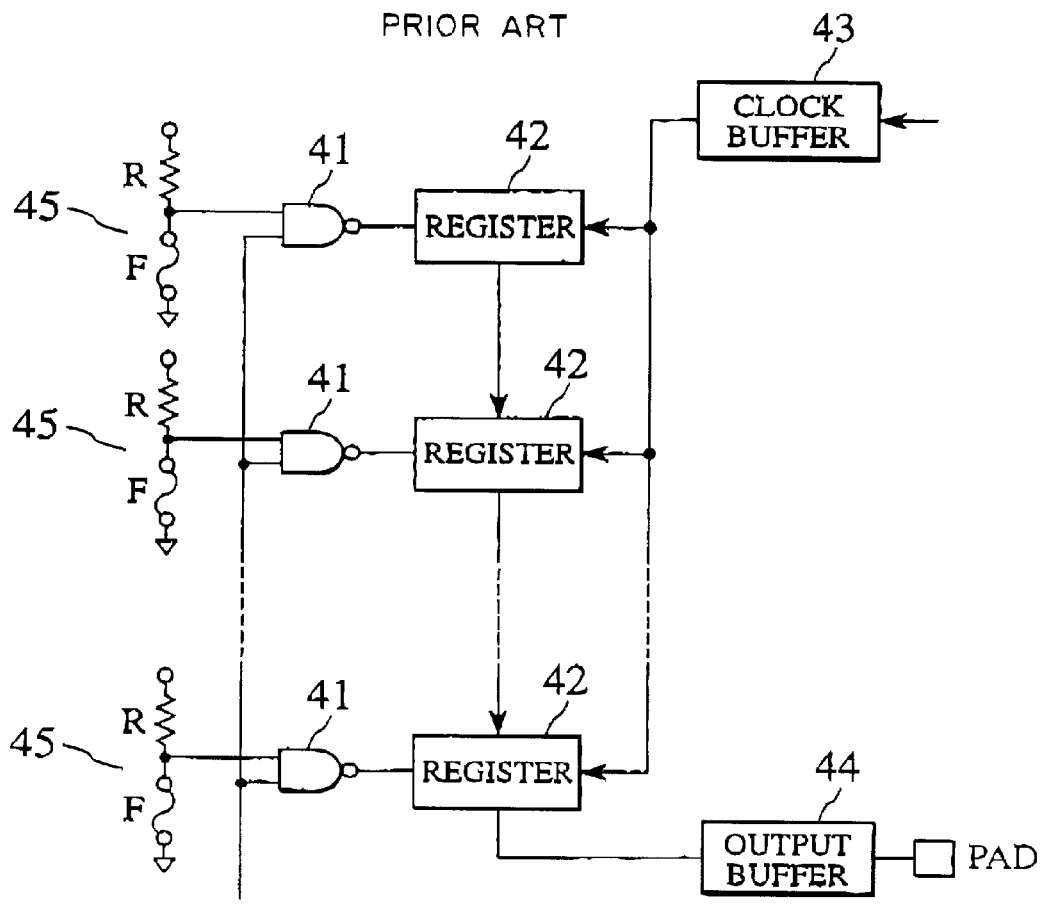
FIG. 4 is a block diagram showing a semiconductor device which is provided with a protective circuit and a test circuit according to the second embodiment of the present invention.

In the configuration of the conventional semiconductor device shown in FIG. 4, the fuse circuits 45 are incorporated regardless of the protective circuits. Accordingly, the gates 41, the registers 42, the clock buffer 43, and the output buffer 44 must be incorporated in addition to the fuse circuits 45. This conventional configuration of the semiconductor device shown in FIG. 4 has a drawback to increase an area of the semiconductor chip.

In the semiconductor device of the second embodiment shown in FIG. 3, the test mode selection-signal TM is the H level and the output of the NOR gate G1 is the L level, during the normal operation mode. In this case, the protective transistor QN keeps the OFF state. On the other hand, during the test mode, the test mode selection signal TM becomes the L level. In this case, the level of the test data item as the output of the test circuit is inverted by the NOR gate G1 and the test data item of the inverted level is transferred to the gate of the protective transistor QN. That is, when the output from the test circuit 21 is the L level, the output of the NOR gate G1 becomes the H level, so that the protective transistor QN becomes ON, and the level of the PAD becomes the voltage Vss.

When the test circuit 21 outputs the test data of the H level, the NOR gate outputs the L level, so that the protective transistor enters OFF, and the PAD enters the floating state (Hiz). Thereby, the test data stored in the test circuit 21 can be output to outside through the PAD.

In the power OFF state, the output of the NOR gate G1 is in the floating state, and the gate of the protective transistor QN thereby enters the floating state. This state introduces a high ESD resistance, like the effect of the first embodiment. Thus, the semiconductor device of the second embodiment can obtain the high ESD resistance with a simple hardware configuration, like the configuration of the first embodiment. In addition to this effect, the protective transistor QN in the semiconductor device according to the second embodiment can be effectively applied to another applications, that is to say, the protective transistor QN can also be used as an output circuit for outputting the test data stored in the test circuit 21. When compared with the configuration of the conventional semiconductor device shown in FIG. 4, it is possible to reduce the total area of the semiconductor device of the second embodiment because it is not necessary to form the registers 42, the clock buffer 43, and the output buffer 44 in the semiconductor device.

Third Embodiment

Figure 5:
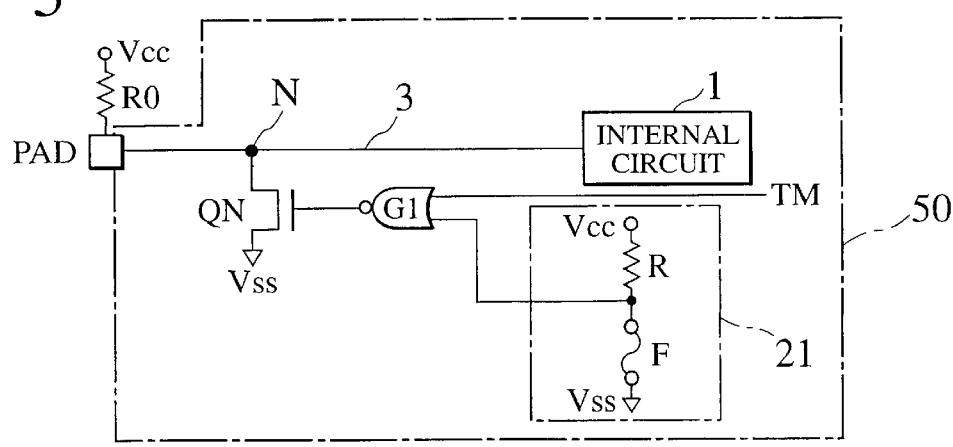
FIG. 5 is a block diagram showing a semiconductor device which is provided with a protective circuit and a test circuit according, to the third embodiment of the present invention.

FIG. 5 is a block diagram showing the semiconductor chip 50 as a semiconductor device which is provided with the protective transistor QN as the protective circuit and the test circuit 21 according to the third embodiment of the present invention. In FIG. 5, the protective transistor QN connected to the PAD through the node N on the signal line 3 has an open-drain connection where the drain of the protective transistor QN is connected to the power voltage source Vcc through a resistance R0. Accordingly, the PAD can not output the test data of the H level to outside. In order to output the test data of the H level to the PAD, it is necessary to connect the power voltage source Vcc to the PAD through the load resistance R0 during the test mode. This load resistance R0 is incorporated by application users. Thereby, it is possible to output the output data of the H level or the L level according to the test data stored in the test circuit 21 during the test mode.

Fourth Embodiment

Figure 6:
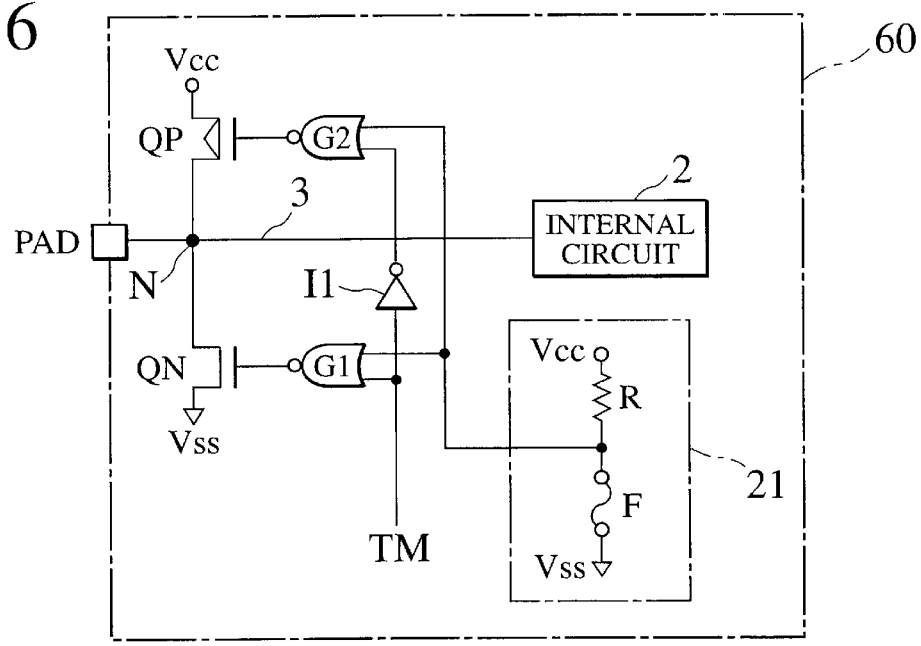
FIG. 6 is a block diagram showing a semiconductor device which is provided with a protective circuit and a test circuit according to the fourth embodiment of the present invention.

FIG. 6 is a block diagram showing the semiconductor chip 60 as a semiconductor device which is provided with the protective transistor QN as the protective circuit connected to the PAD through the node N on the signal line 3 and the test circuit 21 according to the fourth embodiment of the present invention. The semiconductor device shown in FIG. 6 can output of the H level and the L level through the PAD during the test mode by incorporating additional circuits with a simple configuration. As shown in FIG. 6, a PMOS transistor QP is further incorporated in addition to the NMOS transistor QN as the protective transistor. The drain of the PMOS transistor QP is connected to the node N on the signal line 3 and whose source is connected to the power voltage source Vcc. The logical gate G1 complementarity drives the operations of the protective transistor QN and the PMOS transistor QP according to the test data stored in the test circuit 21. That is, the logical gate G1 is made up of the NOR gate G1 and the NAND gate G2 by which the operations of the gates of the protective transistor QN and the PMOS transistor QP are controlled, respectively. The test data stored in the test circuit 21 is output to one input terminal of each of the NOR gate G1 and the NAND gate G2. The test mode selection signal TM is output to another input terminal of the NOR gate G1, and the test mode selection signal/TM, which is inverted by an inverter I1, to another terminal of the NAND gate G2.

Similar to the first to third embodiments, the test mode selection signal TM becomes the L level during the test mode in the fourth embodiment. In this case, when the output of the test circuit 21 is the H level, the levels of both the outputs from the NOR gate G1 and the NAND gate G2 become the L level. Accordingly, the protective transistor QN becomes OFF and the PMOS transistor QP becomes ON, and the PAD provides the output of the H level (Vcc) to outside.

On the other hand, when the output of the test circuit 21 is the L level, the levels of both the outputs from the NOR gate G1 and the NAND gate G2 become the H level. Accordingly, the protective transistor QN becomes ON and the PMOS transistor QP becomes OFF, and the PAD provides the output of the L level (Vss) to outside.

Accordingly, it is possible for the semiconductor device of the fourth embodiment to output both the H level and the L level according to the test data stored in the test circuit 21. Because the level of the test mode selection signal TM is the H level during the normal operation of the internal circuit 2, both the protection transistor QN and the PMOS transistor QP are kept in the OFF state. Thereby, there is no effect to the normal operation of the internal circuit 2. Furthermore, in the power OFF state, the gates of both the protective transistor QN and the PMOS transistor QP enter the floating state. In this case, the PMOS transistor QP functions as a protective transistor to protect the internal circuit 2 against a negative high voltage based on the power source voltage Vcc as a standard voltage.

Fifth Embodiment

Figure 7:
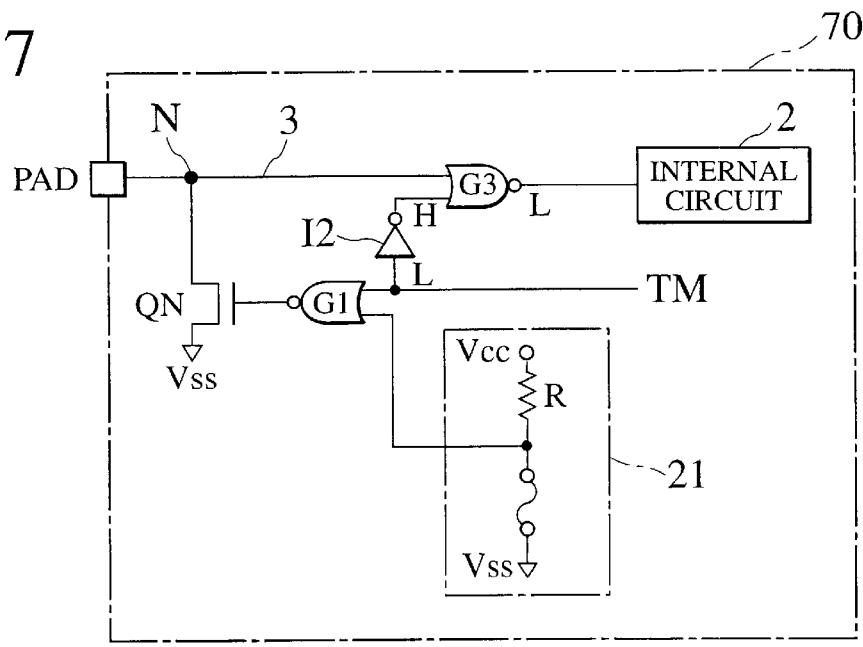
FIG. 7 is a block diagram showing a semiconductor device which is provided with a protective circuit and a test circuit according to the fifth embodiment of the present invention.

FIG. 7 is a block diagram showing the semiconductor chip 70 as a semiconductor device which is provided with the protective transistor QN as the protective circuit connected to the PAD through the node N on the signal line 3 and the test circuit 21 according to the fifth embodiment of the present invention.

The semiconductor device of the fifth embodiment shown in FIG. 7 has a transfer control gate G3 and an inverter I2 in addition to the configuration of the semiconductor device of the second embodiment shown in FIG. 3. This configuration of the fifth embodiment shown in FIG. 7 can protect the transfer of the test data stored in the test circuit 21 to the internal circuit 2. In this embodiment, a NOR gate G3 is used as the transfer control gate whose operation is controlled by the inverted signal /TM of the test mode selection signal TM inverted by the inverter I2. During the test mode in which the test mode selection signal TM is the L level, the output from the NOR gate G3 is kept to the L level. Thereby, the transmission of the test data as the output from the test circuit 21 to the internal circuit 2 halts. During the normal operation in which the test mode selection signal TM is the H level, the level of the PAD is inverted by the NOR gate G3 and the inverted one is then transferred to the internal circuit 2.

It is possible to have the same effect when a NAND gate is used as the transfer control gate instead of the NOR gate G3. The configuration shown in FIG. 5 in which the logical gate G3 is used as the transfer control gate can be applied only when the PAD is used as an input terminal through which a signal is inputted.

Sixth Embodiment

Figure 8:
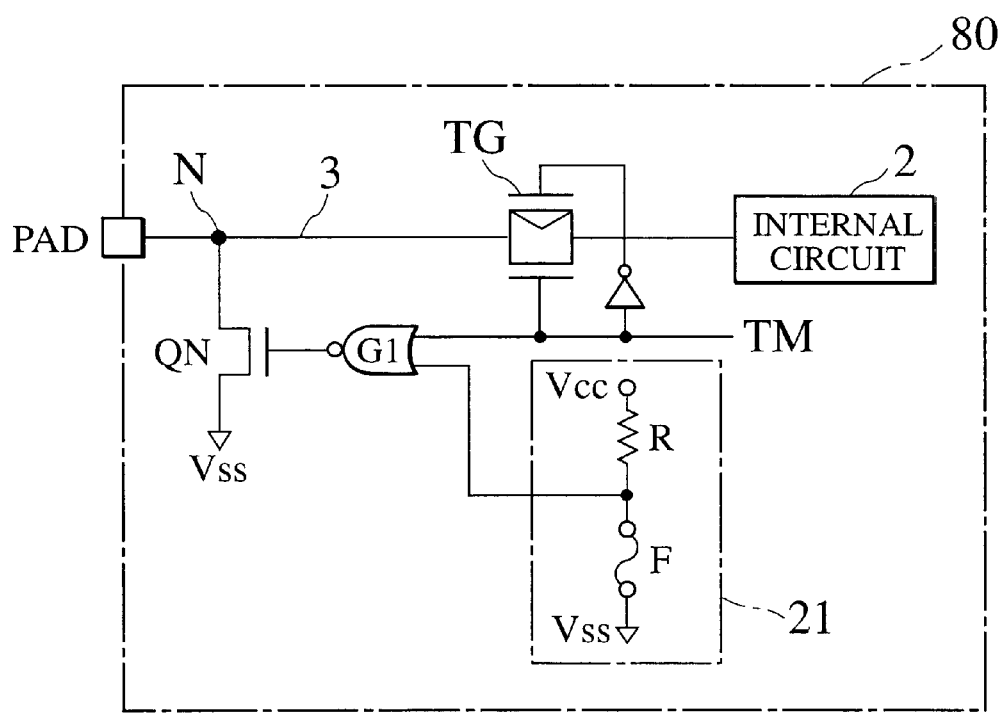
FIG. 8 is a block diagram showing a semiconductor device which is provided with a protective circuit and a test circuit according to the sixth embodiment of the present invention.

FIG. 8 is a block diagram showing the semiconductor chip 80 as a semiconductor device which is provided with the protective transistor QN connected to the PAD through the node N on the signal line 3 and the test circuit 21 according to the sixth embodiment of the present invention. In order to use the PAD as an input/output pad, a CMOS transfer gate TG is formed on the signal line between the PAD and the internal circuit 2. This CMOS transfer gate TG enters OFF while the level of the test mode selection signal TM is the L level. In this case, the test data from the test circuit 21 cannot be transferred to the internal circuit 2, and an input terminal of the internal circuit 2 connected to the CMOS transfer gate TG enters the floating state. During the normal operation mode in which the test mode selection signal TM is the H level, the transfer gate TG enters ON and the input/output data can be transferred between the PAD and the internal circuit 2 because the PAD is connected to the internal circuit 2 through the transfer gate TG. Although the configurations of both the fifth and sixth embodiments shown in FIG. 7 and FIG. 8 are obtained based on the configuration of the second embodiment shown in FIG. 3, the present invention is not limited by this application, for example, both the configurations of the fifth and sixth embodiments shown in FIG. 7 and FIG. 8 can be applied to the configuration of the fourth embodiment shown in FIG. 6.

Seventh Embodiment

Figure 9:
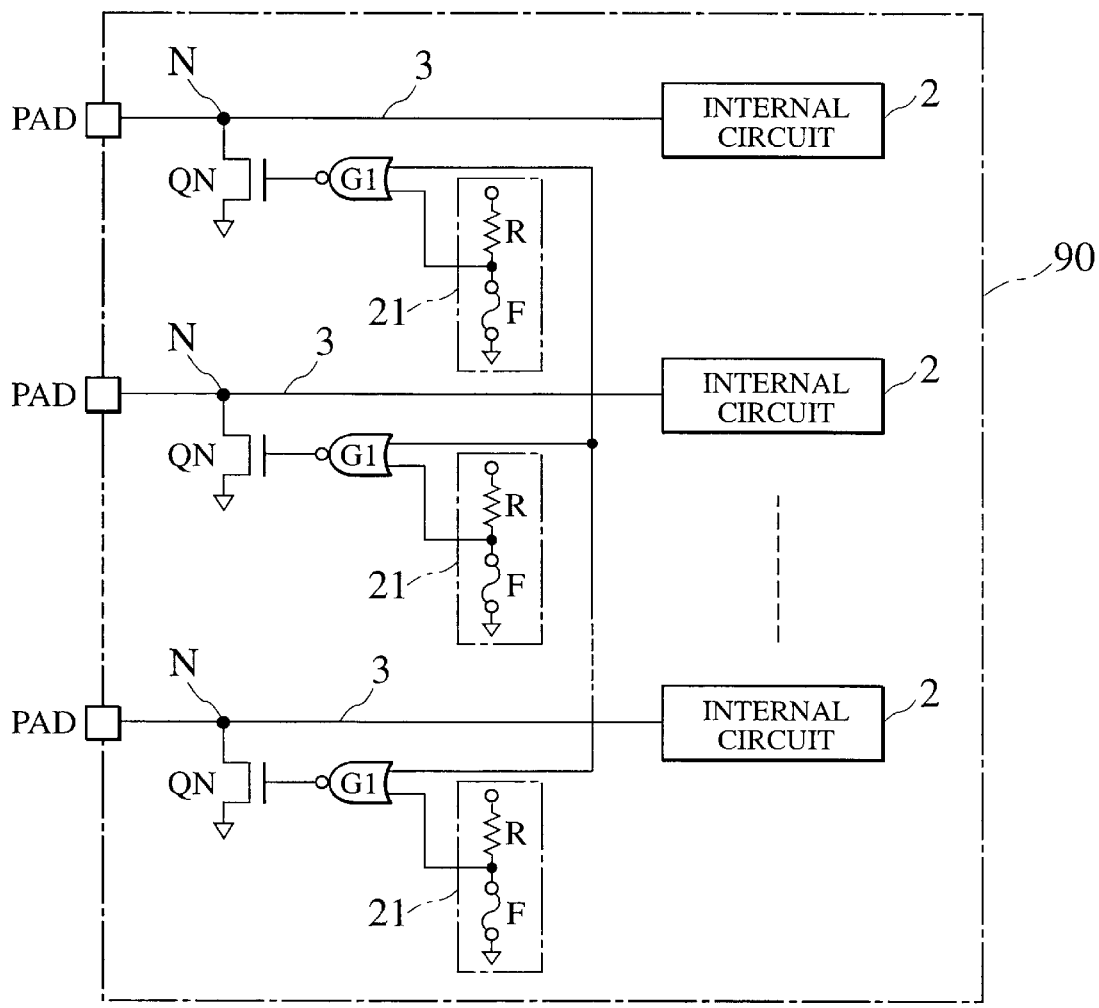
FIG. 9 is a block diagram showing a semiconductor device which is provided with protective circuits and corresponding test circuits according to the seventh embodiment of the present invention.

FIG. 9 is a block diagram showing the semiconductor chip 90 as a semiconductor device which is provided with the protective transistors QN as protective circuits, each connected to corresponding PAD through each node N on each signal line 3, and corresponding test circuits according to the seventh embodiment of the present invention. Although each of FIG. 2, FIG. 3, and FIG. 5 to FIG. 8 shows only one PAD and one internal circuit in order to explain the features of these first to sixth embodiments, in actual semiconductor devices, there are a plurality of the protective transistors QN, a plurality of the PADs, and a plurality of the internal circuits 21 as shown in FIG. 9. In the configuration shown in FIG. 9, each protective transistor QN and each internal circuit 21 are provided to each PAD. Each test circuit comprises the resistance R and the fuse F. In this actual configuration of the semiconductor device, it is possible to store test data of $2^n$ in the internal circuits 21 and then output those data through the PADs to outside in parallel. When compared with the configuration of the conventional semiconductor device shown in FIG. 4, it is not necessary to form a plurality of input/output pins for test data about information of a semiconductor chip. In the configuration of the conventional semiconductor device shown in FIG. 4, the test data stored in the test circuits 45 are output by the following manner:

First, the test data are transferred from the test circuits 45 to the corresponding registers 42 in parallel. The test data stored in the registers 42 are transferred in serial to the output buffer 44 and the PAD based on the clock signal supplied from the clock buffer 43.

On the contrary, because a plurality of PADs can be used as the output PADs connected to the protective transistors QN in the seventh embodiment, the test data of a plurality of bits can be transferred in parallel to outside simultaneously.

Eight Embodiment

Figure 10:
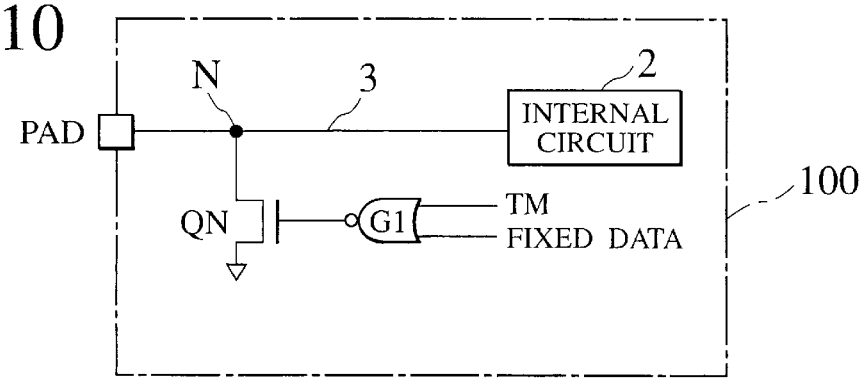
FIG. 10 is a block diagram showing a semiconductor device which is provided with a protective circuit according to the eighth embodiment of the present invention.

FIG. 10 is a block diagram showing the semiconductor chip 100 as a semiconductor device which is provided with the protective transistor QN according to the eighth embodiment of the present invention. In FIG. 10, the protective transistor QN is connected to the node N on the signal line 3, like the first to seventh embodiments. The gate of the protective transistor QN is connected to the NOR gate (G1) as a logical gate. The gate G1 inputs both the test mode selection signal TM and a fixed data.

In the first to seventh embodiments described above, the test circuit 21 stores the test data about the information for semiconductor chip, such as a wafer number, a wafer position, a production date, an address of a redundancy circuit, and the like, and the protective transistor QN is used for supplying the test data to outside through the PAD. However, it is possible to apply the test circuit to the test for the internal circuit 2.

It often happen that some part of address terminals, Input/Output (I/O) terminals, control terminals are driven and a remaining part of them are fixed in voltage potential during the test of the internal circuit 2 by using a probe. In FIG. 10, the voltage level of the PAD is fixed during the test mode by using the protective transistor QN. Taking a concrete example, as shown in FIG. 10, the NOR gate G1 as a logical gate (which is also used in first to seventh embodiments described above) inputs the test mode selection signal TM and the fixed data.

In this case, during the test mode, the test mode selection signal is set to the L level, and the L level as the fixed data is supplied to the NOR gate G1 when it is necessary to set the level of the corresponding PAD to a fixed level of a voltage potential, and the H level as the fixed data is supplied to the NOR gate G1 when it is not necessary to set the level of the corresponding PAD to a fixed level of a voltage potential. Accordingly, the protective transistor QN connected to the PAD to which the L level is supplied becomes ON and the level of the signal line 3 is thereby set to the L level (Vss), and the protective transistor QN connected to the PAD to which the H level is supplied becomes OFF and the level of the signal line 3 is thereby set to an optional L level. During the normal operation in which the test mode selection signal TM is the H level, the protective transistor QN enters the OFF state. This state has been described in the first to seventh embodiments.

In the prior art, it must be necessary to connect a power source terminal and a ground potential terminal to all of pins whose voltage levels are fixed when the internal circuit 2 is tested by using a simple tester. This causes a complicated operations and works. If there are no optimum electric sockets for the test, it must be necessary to connect the pins to the simple tester with solder. On the contrary, the eighth embodiment of the present invention, the level of the pad can be easily set to the fixed voltage level Vss by using the protective transistor QN, it is therefore not necessary to use the simple tester. This causes to decrease the test work.

By the way, although the NOR gate G1 as the logical gate for controlling the protective transistor QN is used in the second to eighth embodiments shown in FIG. 2, FIG. 3, FIG. 5 to FIG. 10, the present invention is not limited by this, for example it is possible to use a NAND gate instead of the NOR gate G1. When the NAND gate is used as a logical gate, the output of the NAND gate must be supplied to the gate of the protective transistor QN through an inverter. In addition, the test mode selection signal TM of the H level (which is a signal of a positive logic) is used during the test mode. This is contrary to the use of the test mode selection signal TM used in the first to eighth embodiments. Like the first to eighth embodiments, it is also possible to output the test data of the test circuit to the PAD through the protective transistor QN, and to set the protective transistor QN is set to the OFF state during the normal mode, and to set the gate of the protective transistor QN to a floating state while a power source is not ON even if the NAND gate is used as a logical gate.

Furthermore, although the NMOS transistor QN is used as the protective transistor in the configurations of the first to eighth embodiments, the present invention is not limited by this, for example, it is possible to use a bipolar transistor as the protective transistor instead of the NMOS transistor QN.

As set forth in detail, according to the present invention, it is possible to obtain the semiconductor device having an excellent ESD resistance where the gate of the protective transistor is set to a floating state during the OFF state of the power source. In addition, according to the present invention, it is possible to use the protective transistor as an output transistor for the test circuit.

While the above provides a full and complete disclosure of the preferred embodiments of the present invention, various modifications, alternate constructions and equivalents may be employed without departing from the scope of the invention. Therefore the above description and illustration should not be construed as limiting the scope of the invention, which is defined by the appended claims.

What is claimed is:
1. A semiconductor device comprising:
an internal circuit;
a pad;
a protective circuit connected between a first power source and a node on a signal line through which said pad and said internal circuit is connected;
a first logical gate connected to a control terminal of said protective circuit, said first logical gate operating to keep an OFF state in said protective circuit during a normal operation of said internal circuit; and
a test circuit,
wherein said first logical gate inputs both an output signal from said test circuit and a control signal in order to set said output signal from said test circuit into an activated state,
said first logical gate outputs said output signal to a gate of said protective circuit according to a level of said control signal, and
said protective circuit outputs said output signal from said test circuit to outside of said semiconductor device via the pad.

2. A semiconductor device as claimed in claim 1, wherein a plurality of said pads and a plurality of said test circuits, each test circuit corresponding to each pad, are incorporated in said semiconductor device, and
each test circuit is a fuse circuit to store a desired data item which comprises a resistance and a fuse connected in series between said first power source and a second power source.

3. A semiconductor device as claimed in claim 1, wherein said protective circuit is a NMOS transistor, whose drain is connected to said node on said signal line, whose source is connected to said first power source, and whose gate is connected to said first logical gate.

4. A semiconductor device as claimed in claim 1, wherein said protective circuit is a NMOS transistor, whose drain is connected to said node on said signal line, whose source is connected to said first power source, and whose gate is connected to said first logical gate.

5. A semiconductor device as claimed in claim 1, further comprises an addition resistance connected between said pad and a second power source.

6. A semiconductor device as claimed in claim 4, further comprises an addition resistance connected between said pad and a second power source.

7. A semiconductor device as claimed in claim 1, further comprises: a transistor connected between said node and a second power source; and a second logical gate for inputting a signal whose level is an inverted level of said control signal in order to activate said output signal from said test circuit, and for controlling an operation of said transistor by providing said output signal from said test circuit to said control terminal of said transistor according to said control signal of said inverted level,
wherein said first logical gate and said second logical gate output complementary signals to said corresponding protective circuit and said transistor, respectively.

8. A semiconductor device as claimed in claim 7, wherein said protective circuit is a NMOS transistor, whose drain is connected to said node on said signal line, whose source is connected to said first power source, and whose gate is connected to said first logical gate, and
said transistor is a PMOS transistor whose drain is connected to said node on said signal line, whose source is connected to said second power source, and whose gate is connected to said second logical gate.

9. A semiconductor device as claimed in claim 1, further comprises a transfer control gate, placed at said node on the signal line through which said pad is connected to said internal circuit, for operating according to said control signal to activate said output signal from said test circuit, and for preventing to transfer said output signal from said test circuit to said internal circuit through said protective circuit.

10. A semiconductor device as claimed in claim 9, wherein said protective circuit is a NMOS transistor, whose drain is connected to said node on said signal line, whose source is connected to said first power source, and whose gate is connected to said first logical gate.

11. A semiconductor device as claimed in claim 10, wherein said transfer control gate is a CMOS transfer gate whose ON/OFF operation is performed based on a value of said control signal to activate said output signal of said test circuit, and said transfer control gate prevents to transfer said output signal of said test circuit to said internal circuit when said value of said control signal indicates to activate said output signal of said test circuit.

12. A semiconductor device as claimed in claim 1, wherein a control signal, indicating whether or not a voltage potential of said pad is fixed to a desired voltage level during an execution of a test for said internal circuit, is transferred to said first logical gate, and said first logical gate controls ON/OFF operation of said protective circuit based on said value of said control signal.

13. A semiconductor device as claimed in claim 12, wherein said protective circuit is a NMOS transistor, whose drain is connected to said node on said signal line, whose source is connected to said first power source, and whose gate is connected to said first logical gate.

14. A semiconductor device as claimed in claim 1, wherein a control signal, indicating whether or not a voltage potential of said pad is fixed to a desired voltage level, is transferred to said first logical gate instead of said output signal from said test circuit.

15. A semiconductor device as claimed in claim 14, wherein said protective circuit is a NMOS transistor, whose drain is connected to said node on said signal line, whose source is connected to said first power source, and whose gate is connected to said first logical gate.

* * * * *

UNITED STATES PATENT AND TRADEMARK OFFICE
CERTIFICATE OF CORRECTION

PATENT NO. : 6,442,009 B1
DATED : August 27, 2002
INVENTOR(S) : Kameda et al.

It is certified that error appears in the above-identified patent and that said Letters Patent is hereby corrected as shown below:

Title page,
Item [*] Notice, delete the phrase "by 110 days" and insert -- by 0 days --

Signed and Sealed this

Twenty-eighth Day of September, 2004

JON W. DUDAS
*Director of the United States Patent and Trademark Office*